United States Patent [19]

Dingwall

[11] 4,045,811
[45] Aug. 30, 1977

[54] SEMICONDUCTOR INTEGRATED CIRCUIT DEVICE INCLUDING AN ARRAY OF INSULATED GATE FIELD EFFECT TRANSISTORS

[75] Inventor: Andrew Gordon Francis Dingwall, Somerville, N.J.

[73] Assignee: RCA Corporation, New York, N.Y.

[21] Appl. No.: 601,833

[22] Filed: Aug. 4, 1975

[51] Int. Cl.$^2$ .................... H01L 27/02; H01L 27/10
[52] U.S. Cl. .......................................... 357/41; 357/45
[58] Field of Search .................................. 357/41, 45

[56] References Cited

U.S. PATENT DOCUMENTS

| | | | |
|---|---|---|---|
| 3,665,473 | 5/1972 | Heimbigner | 357/41 |
| 3,740,732 | 6/1973 | Frandon | 357/41 |

*Primary Examiner*—Edward J. Wojciechowicz
*Attorney, Agent, or Firm*—H. Christoffersen; R. P. Williams

[57] ABSTRACT

A monolithic array of insulated gate field effect transistors useful, for example, as a read-only memory, has means for defining a pre-selected array of operative and non-operative transistors in a row and column arrangement. Non-operative transistors include diffused regions lying in the conductive channel zones thereof which serve to raise the value of the threshold voltage of these transistors above a value normally applied to the gate electrodes of all the transistors in the operation of the device. Operative transistors have no such threshold-raising diffused regions in their channel zones so that they can be turned on by the normally applied voltage. The array is programmable by means of a single photomask.

6 Claims, 9 Drawing Figures

SEMICONDUCTOR INTEGRATED CIRCUIT DEVICE INCLUDING AN ARRAY OF INSULATED GATE FIELD EFFECT TRANSISTORS

This invention relates to integrated circuit devices which include arrays of insulated gate field effect transistors, useful as read-only memories, encoders, programmed switches, adjustable logic gates, and the like.

Known integrated circuit devices, such as read-only memories, include arrays of operative and nonoperative insulated gate field effect transistors, in which the operative transistors represent one binary state, and the non-operative transistors represent the other.

Some of the known read-only memories are maskprogrammed, that is, the coding of information in the memory is done during the manufacture of the device by the appropriate design of one or more of the photomasks used in the photolithographic processing of the device. One such known read-only memory includes an array of MOS transistors in which each transistor is surrounded by a relatively thick oxide layer, called a field oxide, the principal purpose of which is to prevent the flow of leakage currents between individual transistors. In devices of this kind, the field oxide is initially formed as a continuous layer over the entire array. The layer is removed photolithographically wherever an operative transistor is desired and left in place where a non-operative transistor is desired. A thin gate insulator is then formed at the removed sites. Owing to the thickness of the first layer, any gate electrode which is formed on this layer, rather than on a thinner gate insulator layer, will be ineffective at normal voltages to induce a charge carrier channel in the semiconductor body, so that the corresponding device is non-operative. Nevertheless, the devices which are intended to be non-operative can be turned on if a high enough voltage is applied to the gate electrodes thereof. Voltages high enough to prduce this undesired action are often required in high speed circuits. Moreover, under relatively high voltage, leakage between transistors can take place. This known form of read-only memory includes transistors with a relatively compact arrangement, but it is desirable to include more transistors in each unit area of an array.

Figure 1:
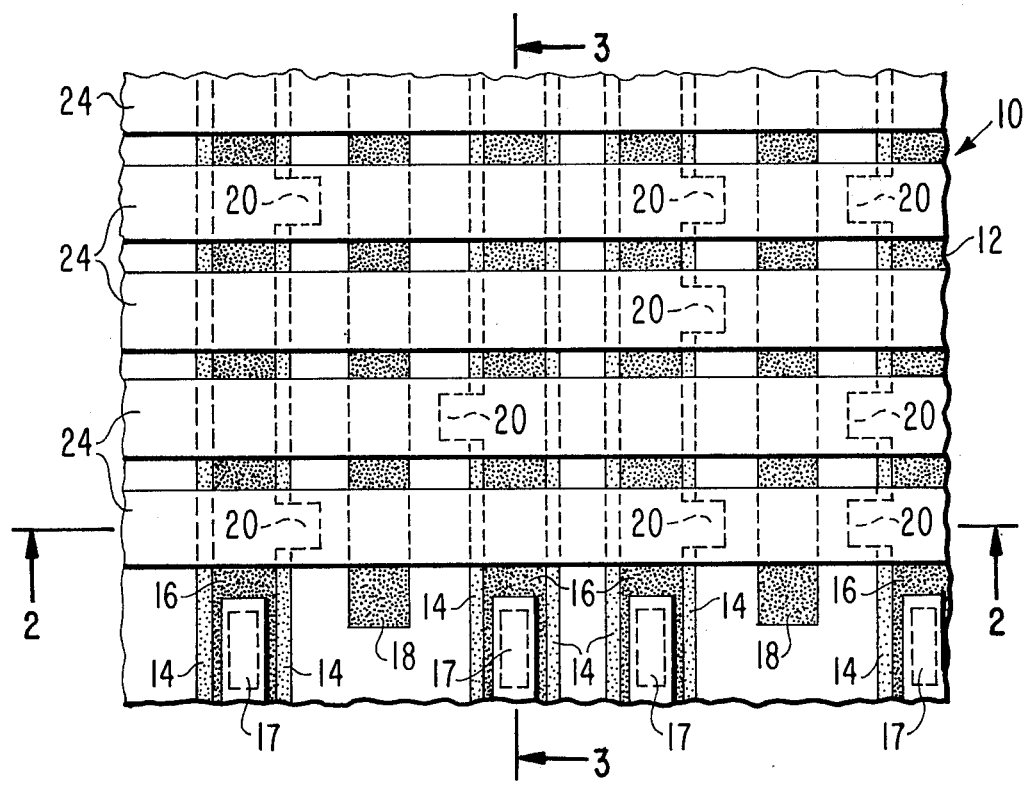
FIG. 1 is a plan view of a portion of an example of the present novel semiconductor integrated circuit device.
Figure 2:
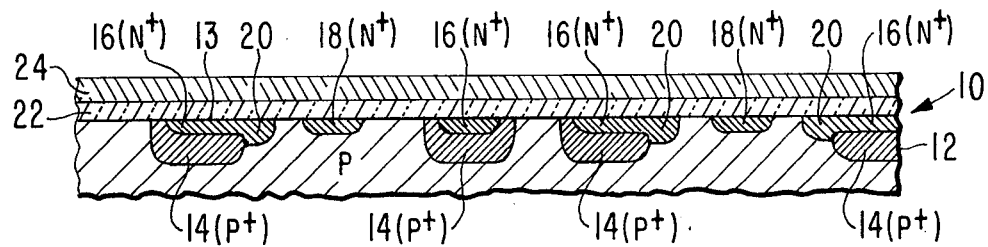
FIG. 2 is a cross-section taken on the line 2—2 of FIG. 1.
Figure 3:
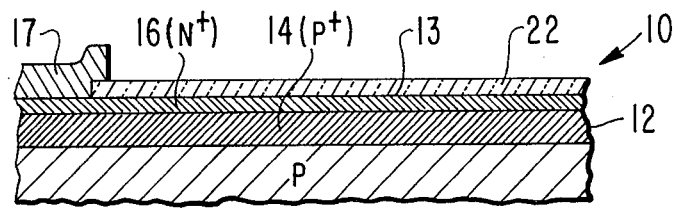
FIG. 3 is a cross-section taken on the line 3—3 of FIG. 1.

A portion of one example of the present novel integrated circuit device, in monolithic form, is illustrated at 10 in FIGS. 1 to 7 of the drawings. The device 10 is formed in a body 12 of semiconductive material, such as silicon, which may be initially a wafer having an upper surface 13 (FIGS. 2 and 3, for example). In the present embodiment, the body 12 may be a wafer of P type silicon. Other integrated circuit device forms may also be used, such as the silicon-on-sapphire form, in which there may be a plurality of islands of semiconductor material on an insulating substrate, or such as the composite or dielectrically isolated form, in which a plurality of dielectrically isolated bodies of semiconductor material are joined together in a unitary structure.

In a monolithic example illustrated, within the body 12 and adjacent to the surface 13, a plurality of parallel, elongated, diffused P+ type regions 14, are arranged in pairs, with the spacing between the member of each pair being greater than the spacing between the pairs for a purpose which will appear below.

Within the boundaries of each of the P+ type regions 14, there is an elongated, diffused N+ type region 16. Also, within the wider spaces between the regions 14 and substantially equally spaced therebetween, there are parallel, elongated, diffused N+ type regions 18. As will appear more fully hereinafter, conductive channels may be established at predetermined locations between the regions 16 and 18. The regions 18 may be connected to a source of potential to act as drain regions and the regions 16, serving as source regions, may be output lines for the device. Each of the regions 16 is contacted by a deposited metal electrode 17, to which contact can be made to connect the regions 16 to external circuitry. Similarly, an electrode not shown, may be provided in contact with each of the regions 18.

At each of the predetermined locations mentioned in the foregoing paragraph, the configuration of the regions 14 and 16 is arranged such that a portion of a region 14 does not lie in the space between the regions 16 and 18. To accomplish this in the present embodiment, the regions 16 are provided with lateral tab-like extensions 20, which extend beyond the lateral boundaries of the P+ type regions 14, toward the regions 18. A conductive channel zone of an operative insulated gate field effect transistor is defined between the ends of these tab-like extensions 20 and the regions 18.

A layer 22 of insulating material (best shown in FIGS. 2 and 3) is disposed on the surface 13 of the wafer 12. The layer 22 should have the clean properties of an MOS gate insulator.

A plurality of parallel, elongated strips 24 of conductive material are disposed on the insulating layer 22. The direction of elongation of the strips 24 is transverse to that of the diffused regions 14, 16, and 18; that is, the strips 24 are parallel to the row direction, while the diffused regions 14, 16 and 18 are parallel to the column direction. The strips 24 overlie the tab-like extensions 20 of the diffused regions 16 and act as gate electrodes for the operative transistors. At those locations where no tab-like extension 20 is present, an operative transistor is not formed. At these locations, the material of the P+ type regions 14 within what would otherwise be the conduction channel zone of these transistors serves to raise the threshold voltage of these devices well above the operating potential normally applied to the strips 24.

In the use of the device 10 as a memory, for example, the regions 18 may be connected to a source (not shown) of positive potential and a selected one of the strips 24, corresponding to a word line of the memory, may be connected to a source of relatively positive potential which is in excess of the threshold voltage of the operative transistors of a row (but below the threshold voltage of the non-operative transistors), so that a charge carrier channel is induced in the operative transistors. As a result, each of the diffused regions 16 which has a tab-like extension 20 in the selected row, will be ohmically connected to the adjacent region 18, while those regions 16 which do not have a tab-like extension 20 in the selected row will remain unconnected. The content of the particular word line represented by the selected strip 24 may then be read out at the contacts 17 by measuring the potentials on the several contacts 17.

In the use of the device 10 as an encoder, as another example, the strips 24 may represent selectable input connections, and the terminals 17 may represent the output connections at which a coded signal representative of the selective input may be read.

The device 10 may be fabricated by conventionally performed photolithographic processes, but in the following novel combination of steps. Those skilled in the art will recognize that the described steps will be interspersed with cleaning, heat treatment, and other steps performed in conventional manner.

Figure 4:
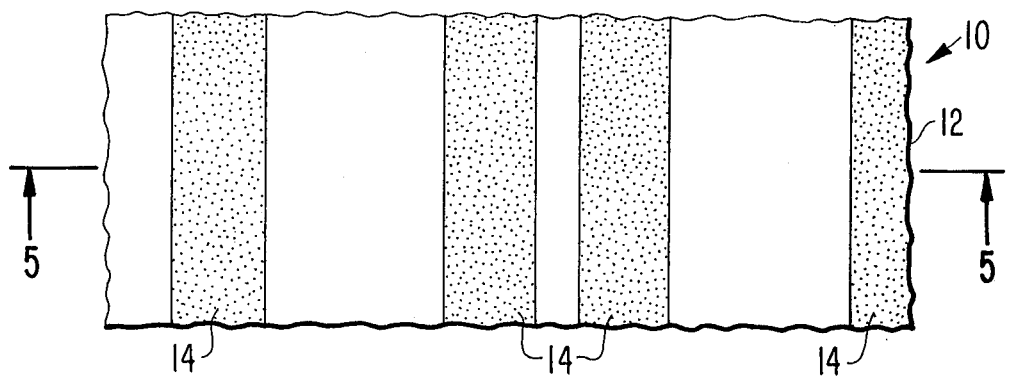
FIG. 4 is a plan view of a portion of an integrated circuit device at an early stage in the preparation thereof.
Figure 5:
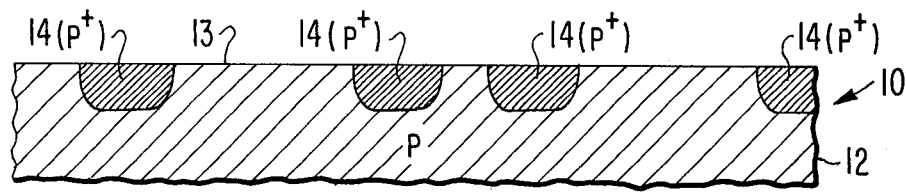
FIG. 5 is a cross-section taken on the line 5—5 of FIG. 4.
Figure 6:
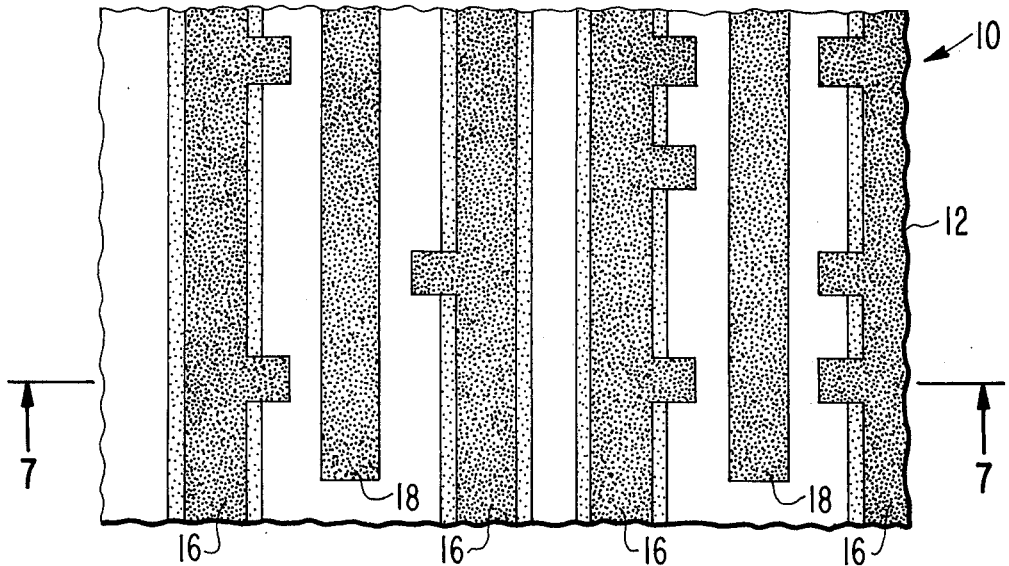
FIG. 6 is a plan view, similar to FIG. 4, but showing the configuration after another step in the process.
Figure 7:
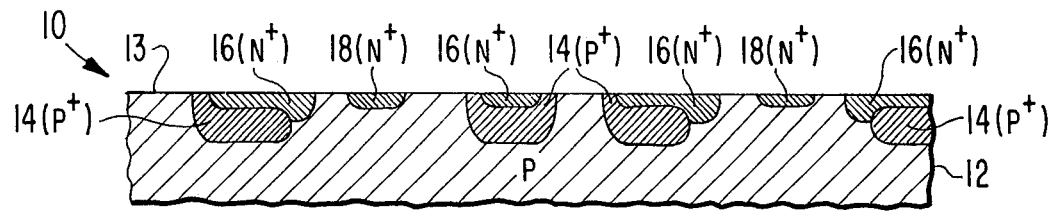
FIG. 7 is a cross-section taken on the line 7—7 of FIG. 6.

First, the surface 13 of the body 12 is masked and a diffusion operation is performed to introduce the regions 14 into the body 12. This step is illustrated in FIGS. 4 and 5. The diffusion masking layer, not shown, is then removed, and a second diffusion masking layer is provided. The photomask which is used to define this second masking layer is designed to leave the tab-like extensions 20 wherever the circuit design indicates that an operative transistor should exist. The N+ diffusion operation is then performed, and the result is as illustrated in FIGS. 6 and 7. The N+ type regions 16 compensate and "overdope" the P type regions 14. This results from the fact that donor elements in most basic semiconductor processes are more soluble in silicon than acceptor elements and impart higher carrier concentrations within the silicon. Ordinarily, phosphorus is used for N type doping, and boron for P type doping, and this result will occur with these materials. For example, for a diffusion of phosphorus having a depth of one micrometer, a typical sheet resistivity of five ohms per square can be achieved, whereas the resistivity for a boron diffusion is approximately 40 ohms per square. Thus, if both N+ and P+ diffusions are superimposed, the N+ diffusion overdopes the P+ diffusion, neutralizing the carriers in the P+ diffusion, so that the end result in the overlap region is an N+ diffusion with just slightly higher sheet resistivity than in an area where the N+ diffusion is into P type rather than P+ type material.

The second diffusion masking layer, not shown, is then removed, and the entire surface 13 is coated with the insulated layer 22. Preferably, this layer is formed under clean conditions, as is conventional in MOS practice, for example, by thermally oxidizing the body 12 in an atmosphere which includes a hydrogen halide, as described in U.S. Pat. No. 3,556,879 to Mayer. Finally, the conductor strips 24 and the contact terminals 17 are formed. This may be done by first forming openings in the insulating layer 22 by means of a conventional photoresist and etching process, then vacuum evaporating a continuous coating of a material, such as aluminum, onto the device 10, and thereafter photolithographically defining the conductor strips 24 and the contact terminals 17.

Figure 8:
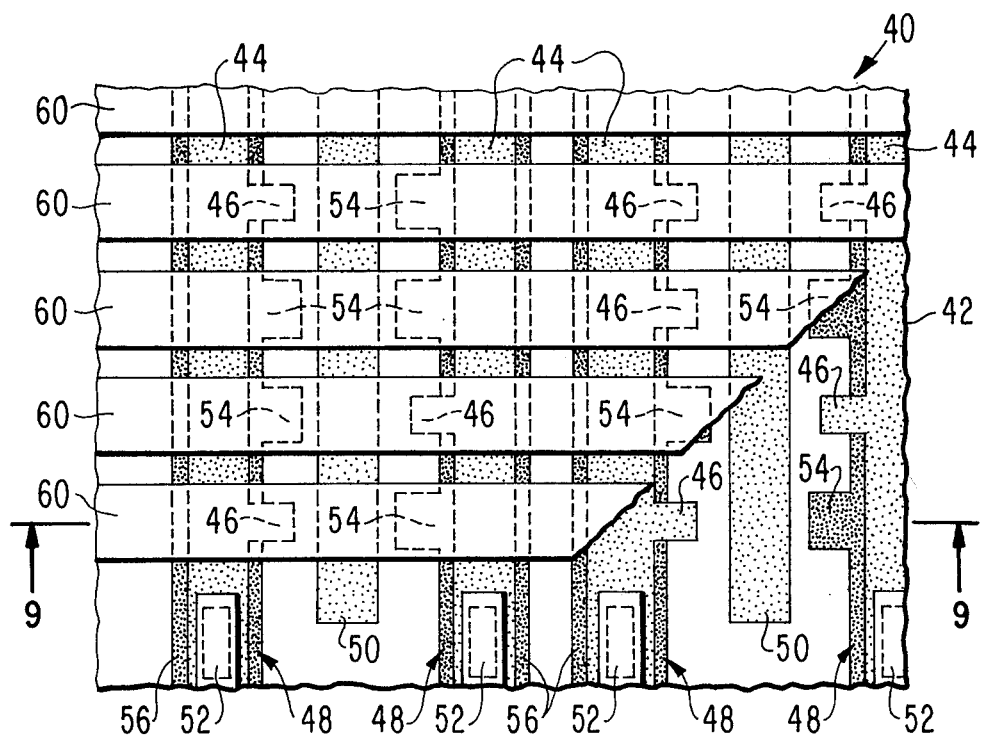
FIG. 8 is a plan view, with parts broken away, of a portion of another example of the present novel device.
Figure 9:
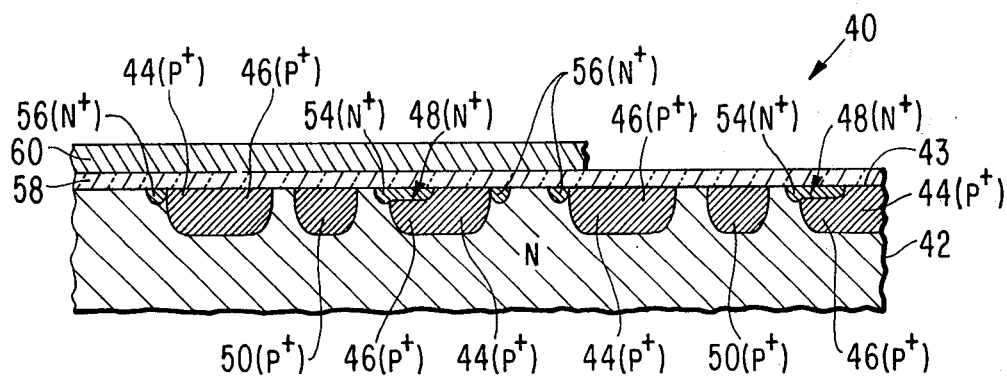
FIG. 9 is a cross-section taken on the line 9—9 of FIG. 8.

A portion of another embodiment of the present novel device is shown at 40 in FIGS. 8 and 9. Like the device 10 the device 40 is a monolithic device and may be formed in a body 42 of semiconductive material such as silicon having a surface 43 (FIG. 9). The device 40 may also be formed in silicon on sapphire or in dielectrically isolated form, and the like.

Unlike the device 10 the basic monolithic body 42 of semiconductive material used to form the device 40 is initially of N type conductivity. Within the body 42 and adjacent to the surface 43 thereof, are a plurality of parallel, elongated, diffused P+ type regions 44 the regions 44 are arranged in pairs with the spacing between the members of each pair being greater than the spacing between the pairs, similar to the arrangement of the regions 14 in the device 10. As illustrated best in the plan view of FIG. 8, each of the regions 44 has a plurality of P+ type tab-like extensions 46 extending from one side thereof. At some locations, the tab-like extensions 46 are not visible in FIG. 8 because they are overdoped, as will be described below, by N+ diffused regions located adjacent to the peripheral edges of the P+ type regions 44. However, the tab-like extensions 46 are regular throughout the array and are located at each place where either an operative or a non-operative transistor may be fabricated.

Between each of the members of each pair of P+ type regions 44 there is an elonated, diffused P+ type region 50. Like the regions 18 of the device 10, the regions 50 may be connected to a source of potential and the regions 44 may be output lines for the device. Each of the regions 44 is contacted by a deposited metal electrode 52 for connecting the regions 44 to external circuitry. Each of the regions 50 may also be provided with a contact, not shown.

A plurality of N+ type regions 48 lie each adjacent to a peripheral boundary of a region 44 which faces toward one of the regions 50. The programming of this embodiment of the memory is accomplished in the design of the regions 48. Wherever a non-operative transistor is desired, the regions 48 are provided with tab-like extensions 54 which overlie the total area, and extend beyond the total area, of the tab-like extensions. The locations of the tab-like extensions 54 are, of course, prselected by the designer to render certain selected transistors non-operative, by raising the threshold voltage of the selected transistors above a predetermined minimum.

At the outside peripheral boundaries of the regions 44 of each pair diffused N+ regions 56 are provided. The purpose of the regions 56 is to prevent leakage between adjacent ones of the regions 44.

A gate insulating layer 58, like the gate insulating layer 22 of the device 10, is provided on the device 40. A plurality of parallel, elongated conductor strips 60, like the elongated strips 24 of the device 10, are disposed on the insulating layer 58.

The operation of the device 40 is much the same as that of the device 10. Operative transistors will exist wherever the tab-like extensions 46 of the regions 44 are not overdoped with a tab-like extension 54 of a region 48.

Although not shown, a more compact array similar to the device 40 may be achieved by omitting the tab-like extensions 54 of the N+ type regions 48 and narrowing the spacing between all of the P+ type regions 46 and 50 respectively. The mask used to form the regions similar to the regions 48 in such device would simply be designed to omit a diffusion of donor impurities adjacent to the regions 44 at the locations of desired operative transistors.

One advantage of the present novel structure is that it does not require a thick field oxide, owing to the leakage preventing diffusions such as the regions 14, 48, and 56. Moreover, the structure can be fabricated with diffusions which may have the same depth and doping concentration as the diffusions which are conventionally used in complementary MOS integrated logic circuits, so that such logic circuits can be combined with the present novel memory on the same chip. Another important advantage of the present novel device is that it can be programmed by means of only one photomask.

What is claimed is:

1. A monolithic integrated semiconductor device formed in a body of semiconductive material, initially of one type conductivity and having a surface, comprising:
   a plurality of parallel, elongated regions of conductivity type opposite to that of said body in said body adjacent to said surface, said regions being arranged in pairs,
   a lesser plurality of regions of said opposite type conductivity, each member of said lesser plurality of regions being disposed between the regions of a separate pair of the first-mentioned regions of opposite type conductivity,
   insulating material on said surface over the spaces between said first-mentioned and second-mentioned regions of opposite type conductivity,
   a plurality of conductive strips on said insulating material and extending transversely of said elongated regions of opposite type conductivity whereby a plurality of MOS transistors are defined at a plurality of locations in said semiconductor device, said second-mentioned regions of opposite type conductivity comprising the drain regions of said transistors, said first-mentioned elongated regions comprising the source regions thereof and the spaces between said firstmentioned and said second-mentioned elongated regions of opposite type conductivity beneath said conductive strips comprising the conduction channel zones of said MOS transistors, and
   means in said body in selected ones of said conduction channel zones for increasing the threshold potential of said selected ones of said conduction channel zones relative to the threshold potentials of unselected ones of said conduction channel zones.

2. A monolithic integrated semiconductor device as defined in claim 1 wherein said body of semiconductive material is initially of P type conductivity, said elongated regions are of N+ type conductivity and said first-mentioned elongated regions have tab-like extensions projecting toward a nearby one of said second-mentioned regions of opposite type conductivity, said conduction channels being defined between the ends of said tab-like extensions and said second-mentioned regions of opposite type conductivity.

3. A monolithic integrated semiconductor device as defined in claim 2 wherein each of said first-mentioned elongated regions of opposite type conductivity is substantially surrounded by a region of P+ type conductivity, each of said tab-like extensions projecting beyond said P+ type regions.

4. A monolithic integrated semiconductor device as defined in claim 3 wherein the P+ type regions totally surround said N+ type regions and wherein the doping density in said tab-like extensions is high relative to the doping density in said P+ type regions whereby the common material of said P+ type regions and said tab-like extensions is effectively N+ type in conductivity.

5. A monolithic integrated semiconductor device as defined in claim 1 wherein said body of semiconductive material is initially of N type conductivity, said regions of opposite type conductivity thereby being P+ type,
   each of said elongated regions of P+ type conductivity having a plurality of tab-like extensions projecting toward a nearby one of said second-mentioned regions of opposite type conductivity in a regular array,
   a plurality of N+ type regions lying each adjacent to a peripheral boundary of one of said firstmentioned elongated regions which faces toward one of the second-mentioned regions of opposite type conductivity, said regions of N+ type conductivity having tab-like extensions which overlie the total area of and extend beyond the total area of selected ones of the tab-like extensions of said first-mentioned regions of opposite type conductivity.

6. A monolithic integrated semiconductor memory device as defined in claim 5 wherein each of the first-mentioned regions of opposite type conductivity has adjacent to its peripheral boundary opposite from that occupied by the first-mentioned N+ type regions another N+ type region.

* * * * *